United States Patent [19]

Ecker et al.

[11] 4,377,316
[45] Mar. 22, 1983

[54] HIGH DENSITY INTERCONNECTION MEANS FOR CHIP CARRIERS

[75] Inventors: Mario E. Ecker, Poughkeepsie, N.Y.; Leonard T. Olson, Jericho, Vt.

[73] Assignee: International Business Machines Corporation, Hopewell Junction, N.Y.

[21] Appl. No.: 238,873

[22] Filed: Feb. 27, 1981

[51] Int. Cl.$^3$ .............................................. H05K 1/18
[52] U.S. Cl. .............................................. 339/17 CF
[58] Field of Search ........... 29/588; 339/17 C, 17 CF, 339/1 BR, 1 BB, 75 R; 361/409

[56] References Cited

U.S. PATENT DOCUMENTS

| | | | |
|---|---|---|---|
| 3,558,993 | 1/1971 | Rigby | 361/409 |
| 3,880,493 | 4/1975 | Lockhart, Jr. | 339/17 CF X |
| 3,900,239 | 8/1975 | Anhalt et al. | 339/17 CF |
| 3,942,854 | 3/1976 | Klein et al. | 339/17 CF |
| 3,952,231 | 4/1976 | Davidson et al. | 339/17 C X |

Primary Examiner—Mark Rosenbaum
Attorney, Agent, or Firm—Sughrue, Mion, Zinn, Macpeak and Seas

[57] ABSTRACT

A system for connecting a semiconductor chip carrier to a printed circuit card is described. The semiconductor chip carrier has a flexible, extendable wiring membrane attached to the bottom thereof which extends beyond the periphery of the semiconductor chip carrier and in the area beyond the periphery is provided with electrical contacts. The electrical contacts are mated to complementary contacts in a printed circuit card which is biased from the semiconductor chip carrier by electrical and thermal contact means. The membrane, inter alia, provides high density electrical contact between the semiconductor and printed circuit card. Various elements thereof and a process for forming the same are described.

7 Claims, 18 Drawing Figures

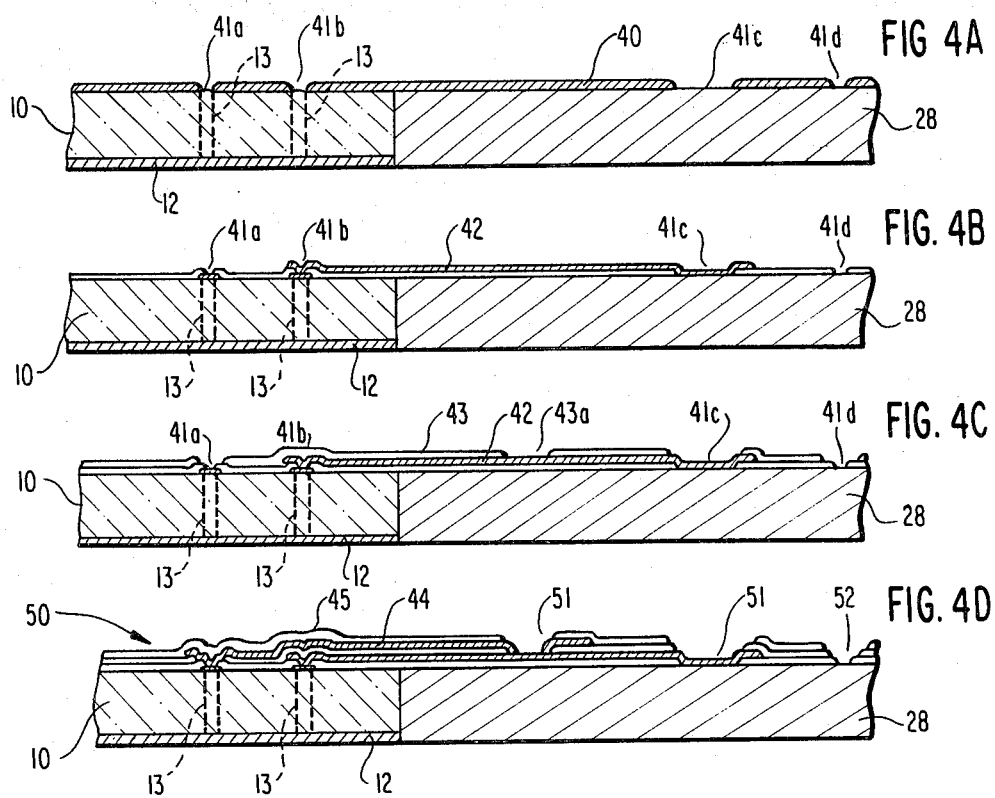
FIG 4A
FIG. 4B
FIG. 4C
FIG. 4D
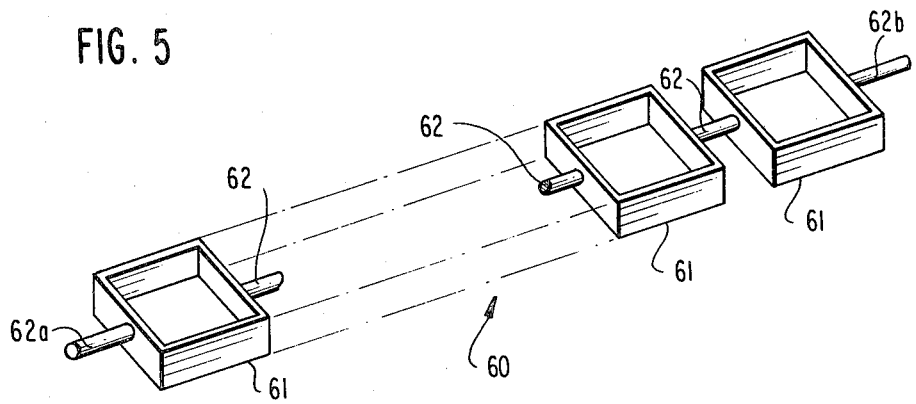
FIG. 5

HIGH DENSITY INTERCONNECTION MEANS FOR CHIP CARRIERS

BACKGROUND OF THE INVENTION

1. Field of the Invention

The present invention relates to improved means to interconnect semiconductor devices or chips carried on an appropriate substrate to a complementary printed circuit card.

2. Development of the Invention

It is well known in the semiconductor art to mount a semiconductor device on a ceramic substrate and to interconnect the same to a printed circuit card employing pins attached to the underside of the substrate which are in electrical contact with the semiconductor device by via holes in the substrate. The pins on the underside of the substrate mate with plated-through-holes located in the printed circuit card. Using current state of the art technology, practical densities for pin structures with area array pin groups is commonly accepted to be 0.1 inch. Attempts to decrease pin spacings below 0.1 inch generally result in stringent manufacturing tolerances, high cost, and increased laminating levels to compensate for D.C. drops and wiring losses caused by the increased plated-through-hole density.

Increasing the number of pins on the underside of the substrate requires a corresponding increase in plated-through-holes in the related printed circuit card. The pins are usually reflow soldered within the plated-through-holes in the card. Increasing the number of pins improves the thermal conduction path from the plated-through-holes through the internal power planes in the printed circuit card. This can result in the need for higher than desirable heating in order to remove a pinned substrate from a printed circuit card. Some secondary effects of this higher required substrate removal temperature are: higher pin and plated-through-hole stress due to differences in thermal expansion coefficients of the materials involved, printed wiring may become electrically discontinuous and plated-through-holes may crack along the "Z" axis.

Increasing the number of pins on the underside of a ceramic substrate is usually achieved by maintaining the basic pin spacing at a 0.100 inch spacing which requires a larger ceramic substrate, a costlier item, and more printed circuit card real estate for mounting. Attempts to reduce the pin spacing from 0.100 inch will usually result in wiring channel blockage within the printed circuit card. While wiring channel blockage may be compensated for by increasing the number of wiring planes internal to the printed circuit card, this is also a costly solution. Further, considering the general trend in the art to higher performance circuitry, increasing the number of internal wiring planes in a printed circuit card would most likely require a change from microstrip transmission lines to a tri-plate transmission line configuration which would result in a further requirement for more internal metal layers to act as A.C. reference planes. Finally, the use of a tri-plate structure would increase the relative amount of dielectric material (epoxy-glass) required and result in a negative aspect ratio of plated-through-hole diameter to printed circuit card thickness, again resulting in an increase in cost.

U.S. Pat. No. 3,594,619 Kamoshida et al relates to a beam lead chip for face bonding to chip carriers. Its primary feature is thermal enhancement, i.e., effecting improved thermal capability by creating electrically passive contacts within a beam lead free region of the chip and providing for face bonding of the contacts to a ceramic carrier substrate. Alternatively, additional beam leads may be employed as thermal paths between the chip and the ceramic carrier substrate. Such a device is self-limiting in that as the electrical interconnection requirement increases the redundant thermal contacts must decrease. The Kamoshida et al invention may be likened to the practice of using dummy controlled collapse solder joints on face bonded chips, except Kamoshida et al do not have the placement freedom nor the efficiency of application of such a procedure.

The present invention may employ a thermal grease over the entire chip surface so that the primary thermal path is from the back of the chip to a protective cover. Hence, thermal flux through the membrane of the carrier is secondary and minimal.

U.S. Pat. No. 3,614,832 Chance et al describes a means for bonding and transferring peripherally disposed electrical jumpers from a semiconductor die to a ceramic carrier. The insulating element of the disclosed decal transfer device is removed by use of a solvent. The removal of the insulating material precludes the option of multi-layer wiring capability as disclosed herein.

U.S. Pat. No. 3,624,462 Phy relates to a semiconductor photo-array structure which relies on a face bonding technique between the semiconductor and its carrier. The carrier contains a fused bundle of short fiber optic elements for effecting the transmission of distinct packets of light with minimal or no optical cross talk. This is a rigid face-bonded mounting solution that does not relate to the compliant membrane of the present invention.

U.S. Pat. No. 3,662,230 Redwants relates to a hermetic package having a header with pins formed so as to effect surface contact to a supporting printed circuit card. A semiconductor chip is "back down" bonded to the header and a thin film wiring system is used on the top side of the semiconductor to provide electrical paths from the semiconductor chip to the ends of the appropriate header pins. Redwantz still employs pins to connect the hermetic carrier to a circuit card whereas one objective of the present invention is to eliminate the need for pins between a carrier and a supporting printed circuit card.

U.S. Pat. No. 3,780,352 Redwants is a division of U.S. Pat. No. 3,662,230 above discussed. Hence, comments applicable to U.S. Pat. No. 3,662,230 are also pertinent to U.S. Pat. No. 3,780,352.

U.S. Pat. No. 3,868,724 Perrino relates to the structure commonly known in the industry today as tape-automated-bonding. This semiconductor interconnection scheme basically comprises a reel mounted continuous tape having sprocket holes disposed along its edges for incremental advance. This tape is personalized so as to have a printed beam lead on a single surface of the tape to which semiconductor dies are bonded, transported, tested, burned-in and eventually encapsulated, excised and attached to or serve as a carrier for. This structure is not suited to area array interconnection nor multilevel wire escape from the semiconductor and is vastly different from the invention herein.

IBM TDB, Vol. 21, No. 2, July '78, P. 569 describes a film device which has some similarity to the membrane of the present invention, but the device of the TDB is primarily constructed integral to a pair of semiconductor dies with the objective, specifically in a memory system, of sharing the pins on a ceramic carrier while allowing for each semiconductor to be maintained in intimate contact with a metallic protective cover for effecting an optimal thermal dissipation path. The film member of the TDB is not employed on a ceramic carrier with the intent of eliminating the carrier pins and making improvements in a related circuit card as per the present invention.

SUMMARY OF THE INVENTION

One object of the present invention is to provide printed circuit cards which have a novel male connection means which reduces the need for complete-through plated-through-holes which can improve printed circuit card performance characteristics.

Another object of the present invention is to provide a novel means of mounting a semiconductor chip carrier or substrate on a printed circuit card by resilient biasing means which serve not only as support means but also as electrical connection means and thermal transmission means.

Yet a further object of the present invention is to provide a flexible, extendible, multi-level wiring membrane which interconnects a semiconductor chip carrier with a complementary printed circuit card in areas exterior to the boundary of the semiconductor chip carrier.

A further object of the present invention is to provide an improved connection system between a semiconductor chip carrier and a printed circuit card.

Another object of the present invention is to provide connection means between a semiconductor chip carrier and a printed circuit card where the number of connections is greatly increased as compared to prior art devices.

Yet a further object of the present invention is to provide connections between a semiconductor chip carrier and a printed circuit card wherein materials of significantly different mechanical and thermal properties can be connected without problems due to such differences in mechanical and thermal properties.

Yet another object of the present invention is to provide connection means between a semiconductor chip carrier and a printed circuit card which does not involve the extensive use of complete-through plated-through-holes in the printed circuit card which would reduce the power transmission capacity thereof.

Still yet a further object of the present invention is to provide a novel combination of a printed circuit card as above described, a resiliently biased semiconductor chip carrier support assembly as above described and a flexible, extendible multi-level wiring membrane as above described which permits very high via packing densities to be achieved on the carrier without the use of conventional pin-type connection means.

The high via packing densities achieved, as above described, allow for a substantial reduction in carrier size, e.g., a 35 mm ceramic chip carrier of conventional pin design may be reduced to 25 mm in size and still provide for an interconnection capability of 300 which exceeds the 35 mm pinned configuration by 104 equivalent pins. Further, the surface mounting area required on the printed circuit card is the same for both the pinned carrier and membrane carrier.

Another object of the present invention is to effect means for the conversion of a blind plated-through-hole from a hollow depression in a printed circuit card to an actual protrusion on the printed circuit card so as to allow for blind registration of wells or contact pads located at the extremity of a wiring membrane as above described to said protrusions.

A further object of the present invention is to provide for the optional reorienting of printed lines within a printed circuit card so that the lines on all planes are skewed relative to one another so as to preclude signal line parallelism and hence negate signal cross talk between any of the printed lines within the printed circuit card yet permit any printed line to be connected by a blind plated-through-hole.

Still a further object of the present invention is to provide for the optional placement of all printed signal planes on one side of the power distribution planes in a printed circuit card where the signal lines are skewed as described above and any may be intercepted by a blind plated-through-hole. Further, only those plated-through-holes that are connected to the power distribution levels need be completly through plated-through-holes in the printed circuit card. Conventional printed circuit cards cannot achieve this configuration because they rely on orthogonal signal plane pairs which results in unacceptable levels of signal coupling. An increase in total wiring capacity of 17 to 34% is also achievable.

Still yet a further object of the present invention is to provide printed circuit cards that optionally are capable of accepting a membrane as above described on both surfaces of the printed circuit card which results in improving the wiring capacity of the printed circuit card. The wiring capacity of such a printed circuit card can show an increase of about 2.6 times that of a conventional printed circuit card as the printed circuit card configuration employs microstrip transmission lines with no plane wiring parallel to another, thereby providing minimal coupled line length.

In accordance with a typical prior art semiconductor chip carrier connected to a printed circuit card using conventional pins, i.e., where the pins are essentially part of the semiconductor chip carrier and are not external to the semiconductor chip carrier as per the present invention, it is only possible, using current state of the art techniques, to provide on the order of 196 pins in a 36 mm semiconductor chip carrier.

In distinction, in accordance with the present invention wherein semiconductor chip carrier/printed circuit card connection means external to the semiconductor chip carrier are utilized, i.e., a flexible, extendible multi-level wiring membrane per the present invention, it is possible to vastly increase the number of connections, for example, on 50 mil centers to provide 729 connections and on 25 mil centers to provide 2,809 connections in such a 36 mm semiconductor chip carrier.

The objects of the present invention are met by the individual components of and the combination of:

A semiconductor chip carrier or substrate which has attached thereto a flexible, extendible, multi-level wiring membrane, said membrane being in electrical contact with one or more semiconductor chips carried on the carrier or substrate and being provided with connection means at areas of said membrane exterior the periphery of said carrier or substrate;

Spring biasing means which supports said semiconductor chip carrier or substrate in contact with a printed circuit card, which spring biasing means is in electrical and thermal contact with said semiconductor chip and said printed circuit card; and A printed circuit card comprising connection means adopted to place said printed circuit card in electrical contact with said semiconductor chip through said flexible, extendible, multi-level wiring membrane and through said substrate.

Optionally, the printed circuit card can comprise connection means and skewed printed wiring interconnected by blind plated-through-holes.

Further, the printed circuit card can optionally comprise connection means on both exposed surfaces for mounting to the flexible, extendible, multi-level wiring membrane.

BRIEF DESCRIPTION OF THE DRAWINGS

FIGS. 4A to 4D illustrate one process for forming a multi-level wiring membrane per the present invention.

FIG. 5 is a broken perspective view of a process frame which may be used to form a multi-level wiring membrane similar to that shown in FIG. 4.

DESCRIPTION OF PREFERRED EMBODIMENTS

Figure 1:
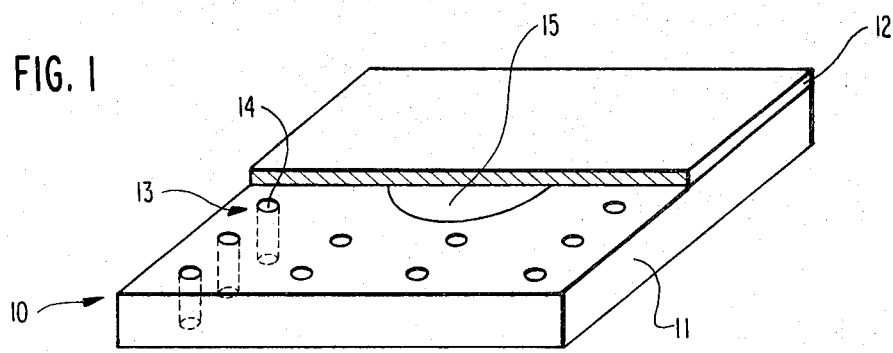
FIG. 1 is an upper perspective view of a semiconductor chip carrier per the present invention (hereafter, unless otherwise indicated, the term "module" will often be utilized to refer to such a semiconductor chip carrier which will eventually have a semiconductor chip mounted thereon).

Referring firstly to FIG. 1, module 10 shown in upper perspective view comprises ceramic substrate or carrier 11 overcoated with photoresist layer 12. In the following, unless otherwise indicated, the terms "semiconductor chip carrier", "substrate" and "carrier" are used interchangeably. While substrate 11 is shown as square, this is not mandatory. Photoresist layer 12 is shown in broken perspective to illustrate the upper surface of substrate 11. Typically a photoresist such as Kodak KTFR, a negative photoresist, is used, and since the purpose of the photoresist layer is to protect the surface of the substrate, it is generally coated to a thickness of about 0.08 mm, e.g., the photoresist is applied as two successive 0.04 mm thick coatings, each coating being baked at 130° C. for 30 minutes. For illustrative purposes via holes 13 are shown filled with metal 14. Metal 14 in via holes 13 serves to electrically join a conventional metallization pattern formed on the top and bottom of the substrate 11; for purposes of simplicity, the metallization pattern is not shown on the top or the bottom of the substrate 11. Suffice it to say that the conventional metallization patterns are utilized to connect the later described semiconductor chip with the later described printed circuit card. Area 15 is free of via holes since this is the area where the later described semiconductor chip will be mounted. As one skilled in the art will appreciate, the number of via holes shown in the substrate is greatly reduced for purposes of illustration; in a preferred embodiment, for a chip 0.200 by 0.200 in., which is approximately 0.015 in. thick, as many as 720 or more via holes can be used, a via hole density much greater than that in the prior art. Area 15 will typically have a dimension of about 0.180 in. in diameter, and is merely shown as circular in FIG. 1 for purposes of illustration. Other configurations can be used. Substrate 11 is typically formed of a ceramic such as alumina.

Except for the extremely high via hole density, and the presence of photoresist layer 12, module 10 is essentially conventional in the art and can be formed to have the configuration shown in FIG. 1 by conventional means.

Figure 2:
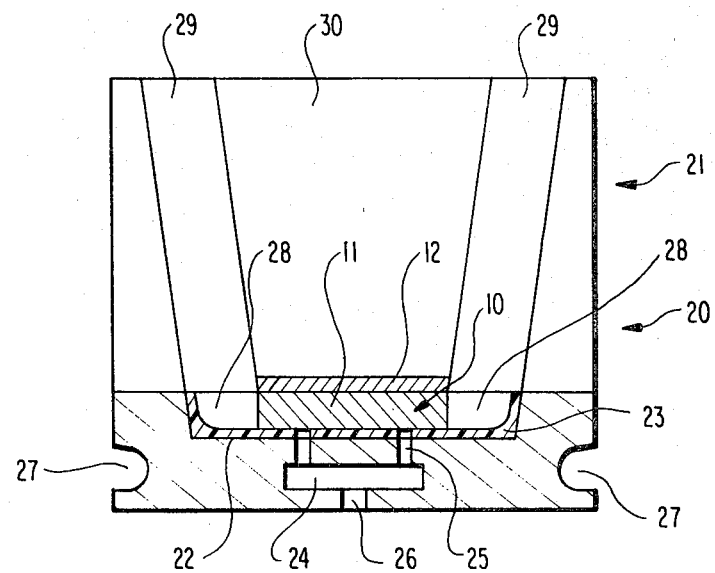
FIG. 2 is a front cross sectional view of apparatus which can be utilized to encapsulate the module of the present invention in a protective resin.

Referring now to FIG. 2, in FIG. 2, and in subsequent Figures unless otherwise indicated, module 10 will merely be generically illustrated for simplicity; one skilled in the art will appreciate, however, that it will have the configuration shown in FIG. 1.

With reference to FIG. 2, module 10 comprising substrate 11 with photoresist layer 12 is shown placed in process tray 20 having thereover epoxy delivery means 21. Certain operations occur before process tray 20 passes beneath epoxy delivery means 21, as will now be explained.

Process tray 20 is a temporary metallic carrier of suitable length to allow the simultaneous encasement of a plurality of modules 10 in epoxy resin. The reusable process tray 20 has a groove region 22 lined with a material 23 of high lubricity such as, for example, Teflon. As will be apparent to one skilled in the art, other materials can be used.

Located beneath the lined groove 22 for the greater part of the length of the process tray 20 is an airtight plenum 24. Plenum 24 is connected at predetermined spacing to the bottom of the lined groove 22 by groups of small holes 25. Plenum 24 is also connected to a pump (not shown) via line 26 for module loading, epoxy feed and heat curing of epoxy, as will later be described. Holes 25 also pass through Teflon layer 23 to permit the module 10 to be firmly held against Teflon layer 23 or to be ejected therefrom upon the application of a negative or positive pressure on plenum 24, respectively. A sliding piston (not shown) is provided below the lined groove 22 prior to module loading. The sliding piston is stationary and covers the holes 25 so that a vacuum may be applied to plenum 24.

In order to load the process tray 20 with properly oriented and positioned modules 10, process tray 20 is engaged along both hold down grooves 27 and advanced at a desired velocity. The advancing movement is away from the stationary piston (not shown) to sequentially uncover a group of holes 25 located at the bottom of the lined groove 22. A suitable loading means, for example, an articulated arm (not shown) can be utilized to pick up and place a module 10 over a desired group of exposed holes 25. This continuous movement and placement operation completely loads the required number of modules 10 into the process tray 20 so that the pressure differential which results when a vacuum is pulled on plenum 24 locks the oriented modules 10 in the process tray 20 in the desired position. Manual loading can also be used, if desired.

The process tray 20 is then moved from the module load area to an epoxy encapsulation area.

As process tray 20 carrying modules 10 passes under epoxy delivery means 21, a continuous flow of epoxy resin is introduced into the areas at the side of modules 10 as shown by numeral 28 in FIG. 2, the epoxy being introduced via lines 29 using conventional delivery means.

Since a plurality of modules 10 are carried in the process tray 20 and separated from each other by the desired spacing in the process tray, as modules 10 pass beneath epoxy delivery means 21 the space between the modules is also filled with epoxy resin via intermittently operated feed line 30 shown in FIG. 2, again conventional delivery means being used. After passage from the epoxy delivery means, each module is thus surrounded in the horizontal plane by uncured epoxy resin.

Process tray 20 then moves from under the epoxy delivery means and typically passes beneath a leveling blade (not shown) which is suitably disposed at the exit of the epoxy delivery means 21 to remove excess epoxy.

Process tray 20 is then moved continuously through an epoxy curing area, for example, a suitable oven (not shown) to effect proper curing of the epoxy. Conventional epoxy resins can be used, for example, such as DURALCO-700, which can be cured at 400° C. by heating for about 45 minutes. The capability of high temperature resistance is required because the subsequent personalization of the multi layer wiring membrane will, at times, require exposure to elevated temperatures, for example, on the order of 400° C. Materials other than epoxy resins can be used and epoxies other than that exemplified can be used. It is, however, highly preferred that any such materials provide a uniform, crack-free surface upon curing and resist personalization temperatures as above explained. Thus, the present invention is not be limited to epoxy materials as encapsulation materials.

Figure 3:
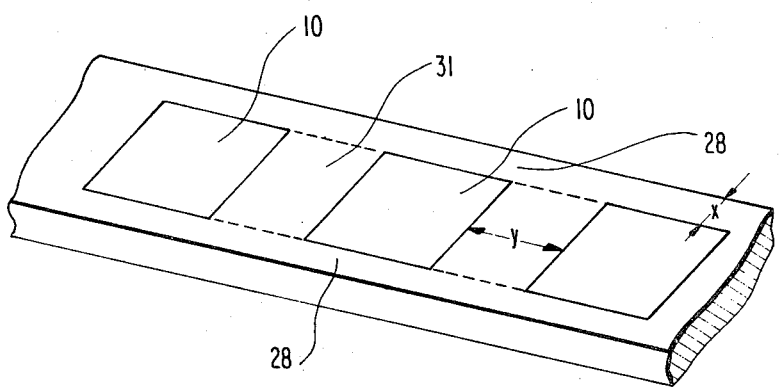
FIG. 3 is an upper perspective view of a plurality of modules per the present invention encased in a protective resin utilizing the apparatus of FIG. 2.

After exit from the epoxy curing area (not shown), plenum 24 is pressurized with a positive pressure which ejects a "stick" of modules encapsulated to have a uniform and crack free surface as shown in FIG. 3 where epoxy 28 is shown surrounding a plurality of modules 10. Numeral 31 in FIG. 3 is utilized to identify that area where intermittent epoxy feed occurs via line 30 shown in FIG. 2; the balance of epoxy 28 is introduced via the continuous flow lines 29 shown in FIG. 2. For modules which have a size in the range (per side) of from 25 mm to 35 mm, epoxy 28 will typically be from 37 mm to 47 mm at dimension x and epoxy 31 will be from 37 mm to 47 mm at dimension y.

As one skilled in the art will appreciate, the "stick" of encapsulated modules 10 may be processed as is or can be cut into individual modules 10, each encapsulated in a surrounding horizontal layer of epoxy 28 and half of the epoxy in area 31.

For simplicity, in the following it is assumed that a module "stick" has been cut into individual modules 10, and the following discussion will be with respect to one such epoxy encapsulated module 10.

The next step per the present invention is to bring each module 10 into electrical contact with a flexible, extendible multi-level wiring membrane (often merely "membrane" herein); such provides a single or multi-level wiring pattern which will be used to connect the metallization pattern on the bottom of module 10 to appropriate contact pads on the edge of the membrane beyond the edge of the module 10 as later explained.

While a number of different materials can be used to form the membrane, most preferably the membrane is a polyimide such as duPont Pyre-ML No. 5878; the thickness of the membrane is not unduly limited, but for typical module sizes as are earlier described, typically the membrane will have a thickness on the order of 0.051 mm and will extend about 6.4 to 7.6 mm beyond the periphery of module 10. Of course, as one skilled in the art will appreciate, neither membrane thickness nor the exact degree of extension beyond module 10 are limited in any substantial fashion. It is also not necessary that the membrane extend an equal distance beyond module 10 at all sides, e.g., module 10 can be square and the membrane rectangular, etc. Other membrane materials include, e.g., Skybond 703 from Monsanto, duPont RC-5057, etc., and the present invention is not limited to the use of polyamides, rather, other polymeric materials which illustrate characteristics similar to polyamides can be used.

In the embodiment, now to be discussed with reference to FIGS. 4A–4D, following processing to a form as shown in FIG. 3, and taking one epoxy encapsulated module as representative, the bottom surface of module 10 which is, of course, surrounded by a smooth, crack-free layer of epoxy, is subjected to processing to obtain a thin multi-level wiring pattern carried in a flexible, extendible membrane, which wiring pattern will connect the metallization pattern on the bottom of module 10 to contact pads at an area beyond the boundaries of module 10 as above indicated.

Referring to FIGS. 4A to 4D, module 10 is generically shown therein provided with plated-through-holes 13 and photoresist 12; for purposes of simplicity of explanation, other elements of module 10 are not shown in FIGS. 4A to 4D. Epoxy 28 formed as earlier described is also shown.

Referring now to FIG. 4A, firstly the bottom of module 10 is spray coated with a polyimide precursor, for example, polyamic acid, to a thickness of about 10–12 microns to form layer 40 as shown in FIG. 4A.

Although not shown, layer 40 is masked, exposed and developed in a conventional manner whereafter polyimide layer 40 is etched at areas 41a and 41b over plated-through-holes 16 and at areas 41c and 41d over epoxy 28.

In more detail, typically a negative photoresist such as Kodak KTFR is coated to a thickness of about 5 microns and thereafter exposed to ultraviolet light through a glass mask in a conventional manner. Development (photoresist removal where etching is to be conducted) is also in a conventional manner using, for instance, Solvesso 150.

After "development" as above, vias are etched through the polyimide layer 40 at the above indicated areas, using, for example, potassium hydroxide at 50° C. for one minute, whereafter the resist is stripped in a conventional manner, using, for example, resist stripper J-100 available from Kodak whereafter the polyamide layer 40 is cured, e.g., at 360° C. for 30 minutes.

Following the above procedure, as explained with reference to FIG. 4B, a first metallization pattern is then formed on polyimide layer 40; the metallization pattern will serve, as will be clear, to conect the metallization pattern on the bottom of module 10 with contact pads later to be described at the extremities of the completed membrane.

While not shown in detail for simplicity, the metallization pattern comprises three layers, chromium (800 Å), copper (40,000 Å) and chromium (800 Å) which are sequentially evaporated into the cured polyimide layer 40 and, of course, into areas 41a–41d. Evaporation is performed in a conventional manner, for instance, at 400° C. under vacuum.

Following the above procedure, a negative photoresist as above described is spray coated as above described over the entire surface of the last deposited chromium layer to a thickness of about 11 microns, whereafter the negative photoresist is masked, exposed and developed to expose the last deposited chromium layer in areas where the metallization pattern is not desired, whereafter the metal layers are etched away in such areas in a conventional manner. The chromium layers are typically etched in Chrome Etchant Type TFD at 40° C. and the copper is layer etched at 50° C. using iron chloride.

Following processing as above, resist is then stripped as earlier described, whereafter the device has a structure shown in FIG. 4B. At this stage, the first polyimide layer 40 carries the desired metallization pattern 42 which will permit contact with the metallization pattern on the bottom of module 10 with desired contact pads at the edge of the finally formed membrane.

After the above procedure, a second coat of the polyimide precursor is applied over metallization pattern 42 and processed in a manner similar to the processing sequence used to form the first polyimide layer 40, whereafter the device has a structure as shown in FIG. 4C with second polyimide layer 43 being exemplified which has via 43a etched therein down to metallization pattern 42.

If only a single metallization pattern is to be present in the membrane, no further processing is required. However, if more than one metallization pattern is desired in the membrane, then in this case a second metallization pattern is formed as above, a third polyimide layer is formed thereover as above, and this sequence can be repeated until the desired number of metallization patterns isolated from each other by a thin polyimide film is obtained.

Assuming that additional metallization patterns are desired, following formation of a second metallization pattern as above described for the first metallization pattern 42 and application of a third polyimide film using the basis procedure as above, a device as shown in FIG. 4D results with the second metallization pattern 44 being shown and third polyimide layer 45 being shown in membrane 50. Also shown are contact pads 51 and etched through groove 52.

As will be appreciated by one skilled in the art, it is necessary that contact pads (later described in more detail) connect with the metallization pattern(s) of the membrane at desired points. This is typically accomplished by applying a negative photoresist such as Kodak KTFR previously described, exposing the same through a mask wherein the areas to be etched away are occluded by the mask, whereafter the photoresist is developed, the polyimide is etched, the photoresist stripped and contact pads (basically holes) etched.

During processing as above, continuous groove 52 is sequentially etched through the polyimide layers and metal present into epoxy 28 using procedures as above exemplified to etch through the chromium, copper and polyamide; this groove will define the final physical size of the membrane 50 since with epoxy removal the edges of the membrane beyond groove 52 will, of course, be removed with the epoxy. For example, for a module which is to have a size of about 25 mm by about 25 mm which is to carry thereunder a membrane having a size of about 39 mm to about 39 mm, the starting "membrane" need only be slightly larger than the final desired membrane size and the groove is merely etched along the edge thereof.

Following groove etching as above, the protective photoresist coating 12 is removed using J-100, whereafter the epoxy 28 is dissolved using Uresolve.

Following the above procedure, a multi-level wiring membrane is formed in situ on the module. However, such a membrane can also be preformed and attached to the module following the procedure below.

Referring to FIG. 5, shown in FIG. 5 is a process frame 60 which comprises a plurality of rectangular frame members 61 joined to each other by ribs 62 with terminal ribs 62a and 62b also being shown. The number of frame members 61 in any process frame 60 will, of course, depend on the number of units desired, and as one skilled in the art will appreciate from the description now to be presented, this number is not limited in any fasion. The terminal frame members are typically provided with ribs 62a and 62b at each end to lock the same into place in a support later described. Process frame 60, is most desirably formed of a material which is insoluble in a conventional epoxy stripper such as Uresolve. While not limitative, process frame 60 is conveniently formed by a conventional die casting procedure. It is to be noted that the individual frame members are open at the top and bottom surfaces.

Process tray 60 can be encased in epoxy resin using an epoxy delivery means as shown in FIG. 2 modified as follows: since the area interior and the area exterior of the individual frame members 61 will be encapsulated, lines 29 and 30 shown in FIG. 2 are replaced by one continuous feed line; since ribs 62a and 62b as shown in FIG. 5 are used to "lock in" the process frame 60 into a process tray such as shown by numeral 20 in FIG. 2, vacuum application means (elements 24, 25 and 26) as shown in FIG. 2 can be omitted; finally, liner 23 does not have holes therethrough. In the following, such is referred to as "modified" support 20. Otherwise, processing is basically the same as explained for FIGS. 2 and 3, with a brief summary being given below.

During actual processing, process frame 60 is placed in modified support 20. Typically process frame 60 is placed against liner 23 in groove 22 in the modified support 20 and locked into place by conventional clamping means (not shown) attached to ribs 62a and 62b.

As process frame 60 passes under epoxy feed means 21, a stream of epoxy resin is introduced into groove 22 so that the individual frame members 61 are completely encapsulated in epoxy resin. In fact, from above the encapsulated process frame 60 appears quite similar to the encapsulated modules shown in FIG. 3 except that each module 10 is replaced by a frame member 61 whose interior is also filled with epoxy. As the process frame 60 moves from under the epoxy delivery means, it typically passes beneath a leveling blade which is suitably disposed at the exit of the epoxy delivery means to remove excess epoxy.

Figure 6:
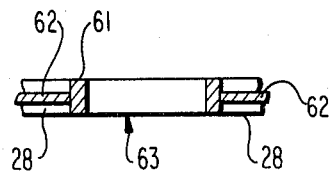
FIG. 6 is a cross-sectional view of a frame member with ribs as shown in FIG. 5 which is encased in epoxy resin.

Following curing as earlier described for FIGS. 2 and 3, the now encapsulated process frame 60 is unlocked from the support and removed. At this stage, one essentially has a "stick" of encapsulated frame members (and, of course, ribs) which are encapsulated to have a uniform and crack-free surface as illustrated in FIG. 6. As one skilled in the art will appreciate, a "stick" of encapsulated frame members may be processed as is or the same can be cut into individual encapsulated frame members.

Epoxy encapsulation is employed as a means to provide a temporary process surface to facilitate multilayer wiring membrane formation in areas which are to be exterior the module region. The epoxy encapsulation should be crack free to facilitate mask alignment and provide distortion free multi-layer wiring membrane fabrication.

FIG. 6 illustrates a cross section of a portion of an epoxy encapsulated or encased frame member 61 after curing. Reference to FIG. 6 shows that the inside of the frame member 61 is filled with epoxy 28 as well as the exterior perimeter of the frame member 61. With reference to FIG. 6, numeral 63 represents the surface of the cured epoxy resin which was in contact with liner 23 in groove 22 of modified support 20. Ribs 62 are also shown.

A multi-level wiring membrane may be formed on surface 63 of epoxy 28 as shown in FIG. 6 following the basic procedure explained with respect to FIG. 4 except, of course, module 10 is replaced by epoxy 28 interior to frame 61, whereafter a conventional commercially available epoxy stripper can be used to dissolve out the epoxy resin.

Figure 7:
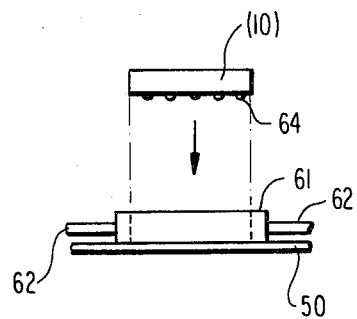
FIG. 7 illustrates in cross-section how a module as shown in FIG. 1 can be joined to a multi-level wiring membrane.

After epoxy resin dissolution, frame member 61 having multi layer wiring membrane 50 affixed thereto can be schematically represented as shown in FIG. 7. A module 10 which has islands of a conventional solder alloy 64 screened on the bottom thereof in the desired array and spacing is lowered into frame member 61 and the islands 64 are oven reflowed in a conventional manner to attach the same to the desired complementary contacts in membrane 50. After washing any flux residue away at the interface of module 10 and membrane 50, a conventional low viscosity adhesive is introduced into the interface of module 10 and multi-level wiring membrane 50 and cured by heating in a conventional manner.

Following the above procedure, frame member 61 can be dissolved away using a solvent for the material of the frame member or the same can be removed from membrane 50 utilizing a conventional lift-off procedure.

Following the above processing, module 10 will be in electrical contact with multi level wiring membrane 50.

In addition to its electrical interconnection function, a further important function of membrane 50 in the present invention is to account for differences in thermal expansion coefficients between module 10 and a printed circuit card (later described) to which module 10 is to be connected. Typically module 10 will have a degree of thermal expansion on the order of $6 \times 10^6$ in/in/°C., whereas a printed circuit card will have a degree of thermal expansion on the order of $19-23 \times 10^6$ in/in/°C. Membrane 50 is thus made of a material which can expand or extend in the lateral dimension, whereby differing degrees of thermal expansion during device use can be accounted for. As will later be clear, since the printed circuit card will have a total expansion which is greater than the total expansion of the module 10, the flexible membrane 10 will expand with the former to compensate to this mismatch in thermal expansion coefficient.

Figure 8:
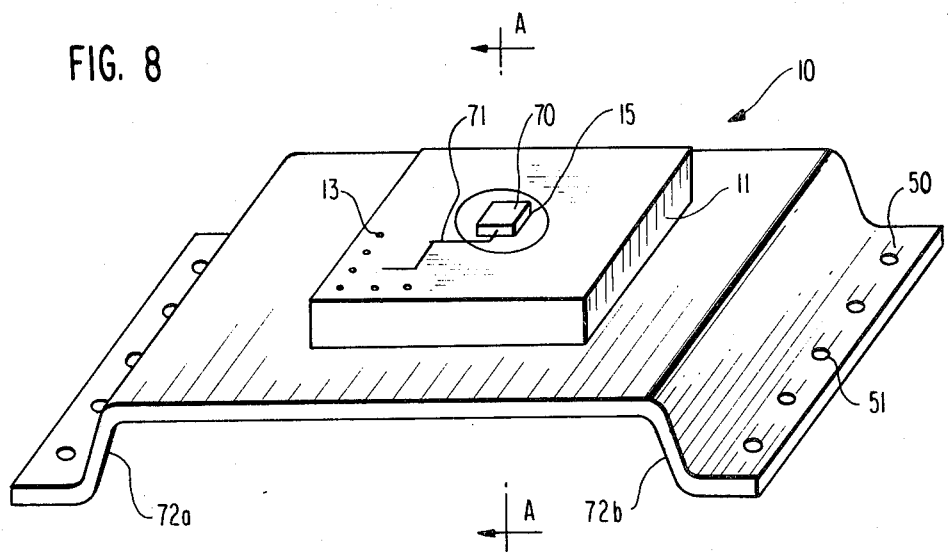
FIG. 8 is an upper perspective view of a module per the present invention having attached thereto a flexible, extendable, multi-level wiring membrane per the present invention.

Referring now to FIG. 8, shown in FIG. 8 is a conventional semiconductor chip 70 which has been mounted in a conventional manner in space 15, earlier indicated to be reserved for such a chip.

For purposes of illustration, a few metal filled via holes 13 are also shown in FIG. 8, with one representative metallization pattern 71 being shown for illustration. As will be appreciated by one skilled in the art from the earlier discussion, a much more complicated metallization pattern (personality will be present on the top (and bottom) of substrate 11, and a substantially greater number of via holes will be present, but full illustration thereof is not necessary for an understanding of the invention.

Chip 70 is electricaly connected through metallization pattern 71 and the metal in via holes 13 to the metallization pattern (personality) on the bottom of substrate 11 (not shown). Membrane 50 in FIG. 8 is shown as having a "Z" configuration where legs 72a and 72b are shown. The "Z" configuration, i.e., legs 72a and 72b, assists in compensating for the thermal expansion coefficient mismatch earlier described. Contact pads 51 are also shown in leg 72b; as one skilled in the art will appreciate, the horizontal portion of legs 72a and 72b can be varied as desired, as can the number of contact pads therein.

Figure 9A:
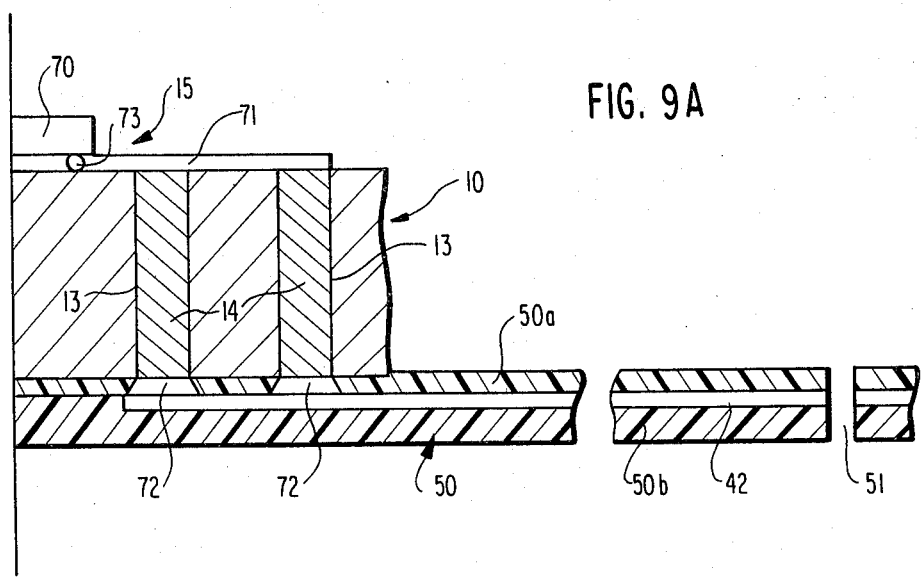
FIG. 9A is a sectional view of the device of FIG. 8 along line A—A' with a printed circuit card thereunder shown in FIG. 9B to illustrate the complementary relationship therebetween.

Turning now to FIGS. 9A and B, FIG. 9A is a detailed sectional view of the element of FIG. 8 shown through plane AA' in FIG. 8 and viewed from the direction of the arrows where like numerals to those utilized in FIG. 8 are used to denote like elements.

In FIG. 9A, metallization pattern 71 is shown interconnected by way of via holes 13 filled with metal 14 to metallization pattern 72 on the bottom of module 10.

In this instance, a two layer polyimide membrane 50 is shown comprising upper polyimide layer 50a and lower polyamide layer 50b, both encasing single metallization pattern 42.

As is shown in detail in FIG. 9A, metallization pattern 42 encased in upper polyimide layer 50a and lower polyimide layer 50b has at appropriate spaces therein metal contact pads 51, which, as later explained, permit contact with a printed circuit board.

Also shown in FIG. 9A is a conventional solder bump 73 which brings chip 70 into contact with metallization pattern 71.

Figure 9B:
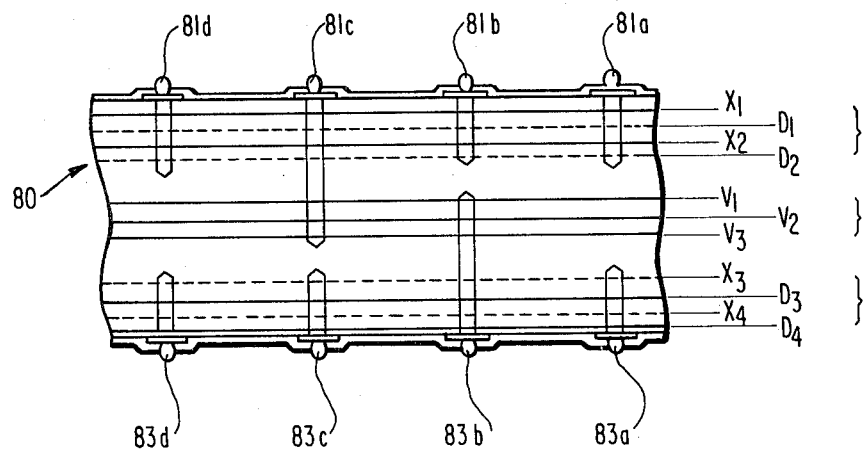

Referring to FIG. 9B, printed circuit card 80 is shown in a position for connection by way of male connection means 81a with membrane 50 via metal contact pad 51; as will be appreciated by one skilled in the art, this will put the printed circuit card 80 into contact with semiconductor chip 70 by way of metallization pattern 42, bottom substrate metallization pattern 72, metal filled via holes 13, upper substrate metallization pattern 71 and solder bump 73. Male connection means 81b-81d are also shown in FIG. 9B; while these will, of course, mate with complimentary contact pads in membrane 50, such complimentary contact pads are not shown for simplicity. Also shown in FIG. 9B are conventional printed circuit card internal wirings such as signal lines $X_1$ to $X_4$ and $D_1$ to $D_4$ (the $D_2$ signal line is contacted by male connection means 81a) and internal power lines $V_1$ to $V_3$.

The use of male connection means 81a in combination with contact pad or connection 51 provides several substantial benefits to the present invention, as now to be discussed. As one skilled in the art will appreciate, a plurality of male/female connection means as shown by 81a and 51, respectively, will be used, but only one such pair is shown in FIG. 9A and B for purposes of illustration.

One substantial benefit of the present invention is that due to the use of male/female connections, the male connections being provided in printed circuit card 80 and the female connections being provided in membrane 50, it is no longer necessary to use conventional pin connections which substantially lower the output density of a printed circuit card such as 80.

As is known in the art, a typical printed circuit card contains a plurality of signal lines, quite often near the surface thereof, oriented in the X–Y directions with respect to each other to reduce noise (cross talk). Further, a typical printed circuit card also contains a plurality of power distribution lines, typically in the interior thereof, for example, running in the Y direcion. Thus, for example, the power distribution lines will run parallel to one group of signal lines and at a 90° angle to another group of signal lines. Such a printed circuit card is connected to a typical prior art module of the pin-type by inserting a pin from the module into a plated-through-hole in the printed circuit card. Such a prior art plated-through-hole typically extends through the entire depth of the printed circuit card. When it is necessary to drill a plated-through-hole completely through a printed circuit card, due to the aspect ratio the greater the depth of the plated-through-hole, the greater the plated-though-hole diameter. This typically, even under current state of the art technology, results from the drilling device walking and slight imprecisions in machinery control. Whenever a plated-through-hole is drilled through a printed circuit card, for example, to reach a desired bottom signal line such as $D_4$ shown in FIG. 9B, it is unavoidable that one or more power lines be removed at the point where the plated-through-hole clearance hole is drilled. The removal of the power line obviously reduces the amount of the line available for electrical transmission, a high undesirable result.

In accordance with the present invention where it is not necessary to use complete-through plated-through-holes in the printed circuit card in all instances, rather, male connections as above described and illustrated by 81a can be used, it is easily seen that there is no substantial power line disruption due to the formation of a complete-through plated-through-hole clearance hole in the printed circuit card. Thus, in accordance with the present invention, power distribution capability is substantially increased.

In more detail, in the present invention, a blind hole such as 82 in FIG. 9B is drilled to a very slight depth in the printed circuit card 80 which permits, due to the aspect ratio, the blind hole which receives connector 81a to have a substantially smaller diameter of higher accuracy than with current state of the art pin-type module systems where complete-through plated-through-hole are used. Thus, in accordance with the present invention such blind holes can be made as small as on the order of about 0.28 mm to about 0.33 mm in diameter and merely to a depth of on the order of 0.165 mm to 0.23 mm, whereas, using current state of the art technology with a pin-type module system, the holes typically have a diameter on the order of 0.76 mm to 0.81 mm.

In a further embodiment of the present invention, rather than utilizing signal lines which are at 90° angles, the signal lines in the printed circuit card are diagonally displaced, for example, assuming four signal lines in a printed circuit card as shown in FIG. 9B identifying these as $X_1$, $X_2$, $D_1$ and $D_2$, and assuming as viewed from above that $X_1$ is at 0°, $D_1$ would be displaced 45° relative to $X_1$, $X_2$ would be displaced 90° relative to $X_1$ and $D_4$ would be displaced 135° relative to $X_1$, each of the signal lines being in a different vertical plane in the printed circuit card, of course.

Thus, e.g., all four of the above signal lines could be oriented toward the upper side of the printed circuit card as shown in FIG. 9B with the diagonal orientation described, and, by using a blind plated-through-hole of the present invention, all four signal lines can be reached from one side of the printed circuit card without disruption of power transmission lines such as $V_1$ to $V_3$ in a deeper (interior) part of the printed circuit card. Of course, the power transmission lines can be reached by a deeper blind plated-through-hole such as 81c. While the plated-through-hole necessary to reach the power lines will be larger due to the aspect ratio, since the number of connections to power lines in a printed circuit card is not overly large as compared to the number of connections required to reach the signal lines, this does not adversely affect device performance.

In similar fashion, signal lines other than $X_1$ can be reached by connections 81b and 81d as shown in FIG. 9B.

Further, using the connection system of the present invention it is possible to mate a membrane to both sides of a printed circuit card; as exemplified in FIG. 9B, bottom connection means 83a, 83b, 83c and 83d can be utilized to reach, from the bottom of the printed circuit card, any of the desired signal lines $X_3$, $X_4$, $D_3$ and $D_4$ or the power lines $V_1$ to $V_3$, with connection 83b being shown as intersecting one of the power lines and connections 83a, c and d being shown as connecting to one of the lower signal lines.

The procedure used to form male connection means 81a is further illustrated in FIGS. 10a–10d, as will now be explained. FIGS. 10a to 10d are a mere partial cross-sections of printed circuit card 80 as shown in FIG. 9B in the area where male connection 81a is to be formed.

Figure 10A:
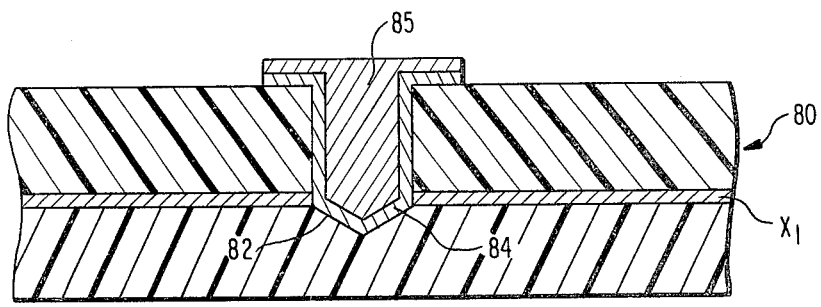
FIGS. 10A–10D illustrate the formation of connections on a printed circuit card as are utilized in the present invention.

With reference to FIG. 10a the printed circuit card is generically indicated by 80.

The first step of forming a male connection 81 is to drill a blind hole 82 of the necessary diameter and depth (as above indicated) into the printed circuit card 80. In this instance, male connection 81a will connect with signal line $X_1$ as is shown in FIG. 10a after blind hole 82 is drilled. As compared to FIG. 9B, other signal lines and power lines are omitted for purposes of simplicity.

Nextly, a copper blind plating is conducted as illustrated by 84 in FIG. 10a. Blind plating is in a conventional manner to a thickness of 0.001 to 0.003 inches and the blind plate will extend beyond the edges of blind hole 82 as shown in FIG. 10a. The exact dimension that blind plate 84 extends beyond blind hole 82 is not overly important, but generally is selected to adequately accommodate drilling and art work positional tolerance. If the blind plate 84 is too small, this could result in severing upon drilling the signal wiring connection to the blind plate 84.

Following the above procedure, screen filling is conducted using a conventional eutectic solder paste such as tin-lead so that the blind hole 82 and blind plate 84 are completely filled and covered by the screen fill, as illustrated by numeral 85 in FIG. 10a.

Figure 10B:
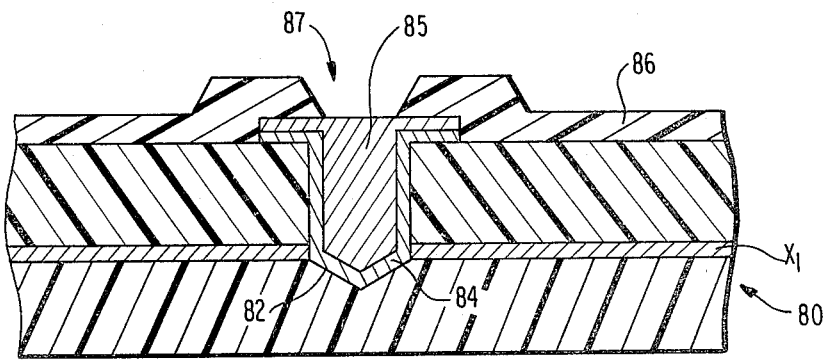

As illustrated with respect to FIG. 10b, thereafter a conventional epoxy coating which is UV curable is coated over the device as shown in FIG. 10a, to a thickness of 0.005 inches. Following masking, exposure and development of the epoxy coating in a conventional manner, the epoxy coating illustrated by numeral 86 in FIG. 10b will have a via hole 87 formed by the above masking procedure shown in FIG. 10b.

Figure 10C:
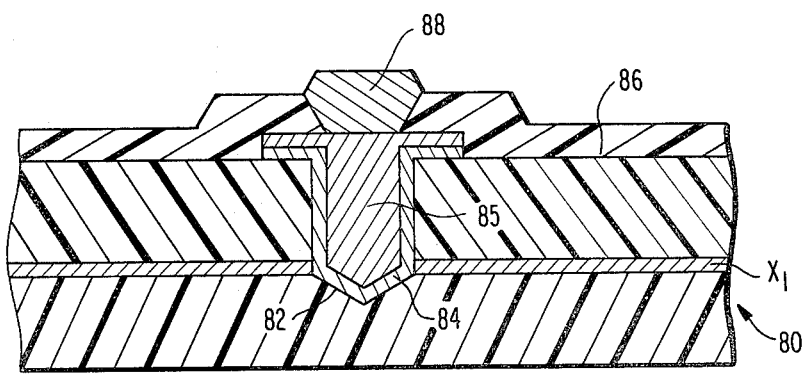

Following the above processing, and as explained with respect to FIG. 10c, via hole 87 is filled with solder screen lug 88 in a conventional manner. It is preferred that lug 88 be formed of the same material as screen fill 85, and these are merely illustrated as separate in FIG. 10c for purposes of illustration.

Figure 10D:
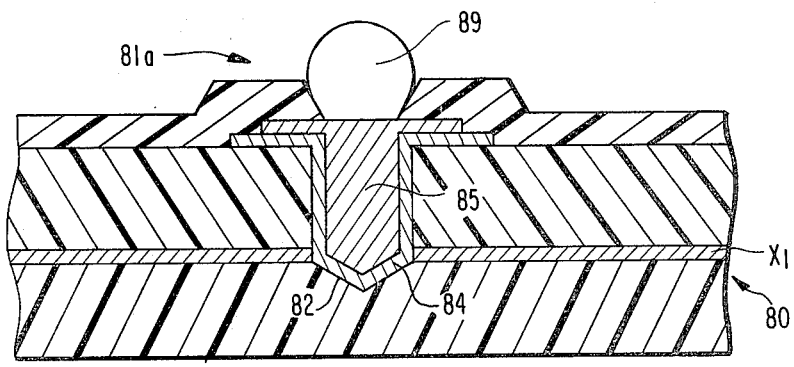

Following the above procedure, as shown in FIG. 10d, pin section 89 is formed by a reflow technique at the eutectic tin-lead liquidus temperature (181° C.), whereupon male connection 81a as generally illustrated in FIG. 10d is obtained. Male connection 81a, as shown in FIG. 10d, will typically be 0.010 inch in diameter and about 0.006 inch high.

Figure 11:
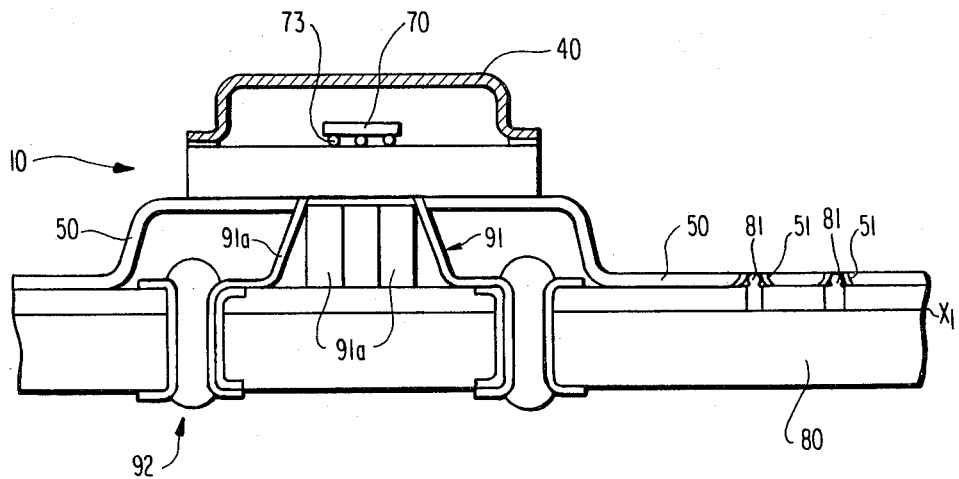
FIG. 11 is a cross sectional schematic view of a completed combination per the present invention.

FIG. 11 illustrates a final combination per the present invention, i.e., shows module 10 of the present invention carrying semiconductor chip 70 thereon in complete electrical connection with a printed circuit card 80 via membrane 50, as will now be described in detail. For complete illustration, solder bumps 73 are shown in FIG. 11 which contact the chip 70 and the upper substrate metallization pattern (not shown).

Referring to FIG. 11, like numerals therein are utilized to those in FIGS. 1–10 to represent like elements.

As shown in FIG. 11, prior to final assembly a cover 90 is provided over module 10 to protect the same from the environment. Cover 90 may, for example, be formed of ceramic or metal, and typically is a metal such as Kovar. Cover 90 may be secured to module 10 by means of any conventional solder alloy. If desired a conventional thermal grease (not shown) may be applied over the chip.

Membrane 50 is generically shown in FIG. 11. Of course, membrane 50 has the structure as described in detail in FIGS. 4 or 9, but various elements thereof are not shown in FIG. 11 for purposes of simplicity. Module 10 is shown attached to printed circuit card 80 by means of leaf spring cluster 91. Leaf spring cluster 91 comprises a plurality of leaf springs some of which are in the plane of the cross section shown in FIG. 11 as indicated by numerical 91a while others lie behind the cross sectional plane (and of course in front of the cross sectional plane) of FIG. 11 as illustrated by numeral 91b. Suffice it to say that leaf springs 91a and 91b function in a similar fashion, and explanation will merely be given for leaf springs 91a.

Holes (not shown) are provided in membrane 50 so that leaf springs 91a will be in contact with module 10, more correctly will be in electrical contact with via holes which extend through module 10 (these via holes are not shown but they are as illustrated in detail in FIG. 9), with the consequence that the leaf spring cluster will permit power distribution to chip 70 by way of the via holes filled with metal (not shown in FIG. 11) and the metallization pattern (not shown) formed on the top of module 10.

As shown in FIG. 11, leaf springs 91a are maintained in electrical contact with printed circuit card 80 by means of plated-through-holes generally indicated by 92, the plated-through-holes being preferably solder filled for good electrical contact. It is to be specifically noted that not only does the leaf spring cluster 91 thus serve the purpose of supporting module 10 and the device(s) carried thereon, but, in addition, the leaf spring cluster 91 also serves for power distribution to module 10 by way of the metallization pattern on the bottom of module 10, the via holes therein (not shown) and the metallization pattern on the top of module 10 (not shown). Further, leaf spring cluster 91 also provides a thermal path from module 10 to printed circuit card 80, thereby permitting operation of semiconductor chip 70 at reduced temperatures to be effected.

Leaf spring cluster 91 is attached to the under side of module 10 using a high temperature solder alloy such as 95% Pb/5% Sn and a parallel gap reflow head, i.e., a resistance heater where two electrodes are adjacent one another and insulated from one another. The gap is electrically bridged by the piece to be soldered as a suitable current is passed from electrode to electrode through the piece to be soldered. The electrical resistance of the piece to be soldered and the current passing through the piece to be soldered determine the temperature of the piece to be soldered. This procedure is well known in the art.

Multi-level wiring membrane 50 is brought into selective electrical contact with circuit card 80 as illustrated in FIG. 11 by registering male connection means 81 with contact pad or connection means 51 shown carried in membrane 50 (details thereof are shown in FIG. 9). Signal line $X_1$ is also schematically shown in FIG. 11.

As one skilled in the art will appreciate, of course, the metallization pattern or patterns carried in membrane 50 are in selective electrical contact with the metallization pattern (or metal pads, as the case may be) on the bottom of substrate 11 which are, in turn, in contact with the metallization pattern on the top of substrate 11 through the metal filled via holes, which in turn are in appropriate electrical contact with semiconductor chip 70. In similar fashion, the female connection means or contact pads 51 shown in FIG. 11 are in electrical connection with various signal lines or power lines in circuit card 80, depending upon their location on printed circuit card 80 and their depth of extension into printed circuit card 80.

Further, as one skilled in the art will appreciate, a vastly greater number of connections will be made between multi-level wiring membrane 50 and printed circuit card 80, but only two are shown in FIG. 11 for purposes of illustration. Following mating as illustrated in FIG. 11, male connection means 81 and contact pads 51 are reflow soldered in a conventional manner to secure the same.

While the invention has been described in detail and with reference to specific embodiments thereof, it will be apparent to one skilled in the art that various changes and modifications can be made therein without departing from the spirit and scope thereof.

What is claimed is:

1. A connecting system for semiconductor devices which comprises:
    a semiconductor carried on one major surface of a substrate, said semiconductor being in selective electric contact through said substrate with an opposed major surface of said substrate;

a flexible, extendable, synthetic resinous membrane attached to the opposed major surface of said substrate, said membrane carrying internally a conductive metal pattern which is in selective electrical contact with said semiconductor through said substrate, said membrane having an area greater than said substrate and, in the area thereof exterior the periphery of said substrate, being provided with electrical contacts in electrical communication with said conductive metal pattern;

a printed circuit card in electric contact with said semiconductor by way of electrical contacts in said printed circuit card which complement the electrical contacts in the periphery of said membrane and are in electric contact therewith; and biasing means between said substrate and said printed circuit card, said biasing means maintaining said semiconductor and said printed circuit card in thermal and electrical contact and separating said substrate and said printed circuit card.

2. The connecting system of claim 1 wherein said membrane is formed in situ on said substrate.

3. The connecting system of claim 2 wherein said membrane comprises a polyimide resin.

4. The connecting system of claim 3 wherein said electrical contacts in said membrane are female contacts and said electrical contacts in said printed circuit card are male contacts.

5. The connecting system of claim 3 wherein said male contacts extend only partly into said printed circuit card.

6. The connecting system of claim 5 wherein said male connections are provided on both sides of said printed circuit card, whereby a membrane as defined can be mounted on both sides of said printed circuit card.

7. The connecting system of claim 1 wherein said printed circuit card carries therein a plurality of signal lines which are skewed relative to one another, whereby cross-talk between signal lines is reduced.

* * * * *